United States Patent
Moon et al.

(10) Patent No.: US 10,374,135 B2
(45) Date of Patent: Aug. 6, 2019

(54) LIGHT-EMITTING DEVICE PACKAGE

(71) Applicant: LG INNOTEK CO., LTD., Seoul (KR)

(72) Inventors: Keal Doo Moon, Seoul (KR); Sung Joo Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 260 days.

(21) Appl. No.: 15/527,589

(22) PCT Filed: Nov. 4, 2015

(86) PCT No.: PCT/KR2015/011738
§ 371 (c)(1),
(2) Date: May 17, 2017

(87) PCT Pub. No.: WO2016/080676
PCT Pub. Date: May 26, 2016

(65) Prior Publication Data
US 2019/0157531 A1    May 23, 2019

(30) Foreign Application Priority Data
Nov. 18, 2014   (KR) .................. 10-2014-0160623

(51) Int. Cl.
*H01L 33/62* (2010.01)
*H01L 27/15* (2006.01)
*H01L 33/54* (2010.01)
*H01L 23/00* (2006.01)

(52) U.S. Cl.
CPC ............. *H01L 33/62* (2013.01); *H01L 24/14* (2013.01); *H01L 27/15* (2013.01); *H01L 33/54* (2013.01); *H01L 2225/06513* (2013.01); *H01L 2933/0033* (2013.01)

(58) Field of Classification Search
CPC .......... H01L 33/62; H01L 33/54; H01L 24/14; H01L 27/15
See application file for complete search history.

(56) References Cited

U.S. PATENT DOCUMENTS

2006/0103302 A1   5/2006  Tanaka et al.
2007/0228386 A1  10/2007  Shie et al.
2015/0155330 A1   6/2015  Oh et al.

FOREIGN PATENT DOCUMENTS

| JP | 2006-140197 A | 6/2006 |
| KR | 10-0855062 B1 | 8/2008 |
| KR | 10-1099494 B1 | 12/2011 |
| KR | 10-2013-0137772 A | 12/2013 |
| KR | 10-2014-0092088 A | 7/2014 |

*Primary Examiner* — Anthony Ho

(74) *Attorney, Agent, or Firm* — Birch, Stewart, Kolasch & Birch, LLP

(57) ABSTRACT

An embodiment provides a light emitting device package comprising: a package body; a first lead frame and a second lead frame, of which at least a part of each is inserted into the package body; and a light emitting device electrically flip bonded to the first lead frame and to the second lead frame, wherein the package body forms an electrode separation line between the first lead frame and the second lead frame, and the electrode separation line has at least two curved portions.

20 Claims, 6 Drawing Sheets

[Fig. 1]
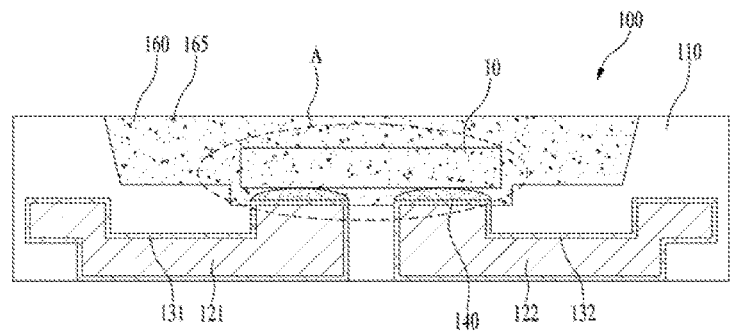
[Fig. 2a]
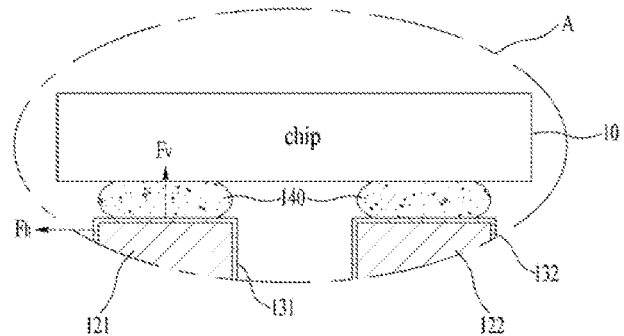
[Fig. 2b]
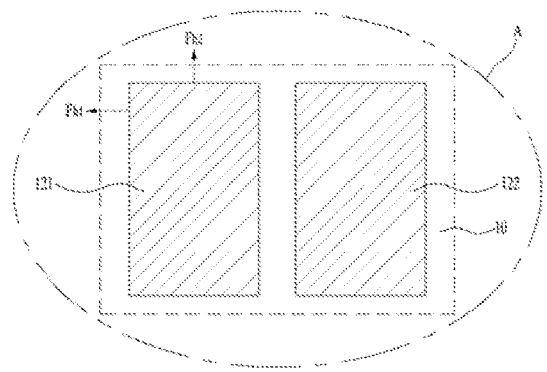

[ Fig. 3 ]
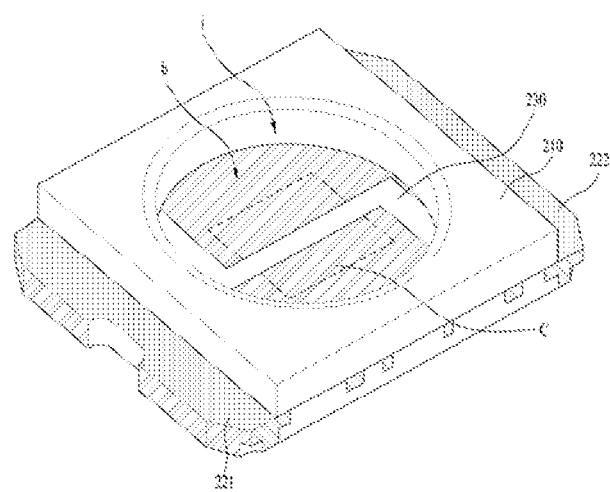
[ Fig. 4 ]
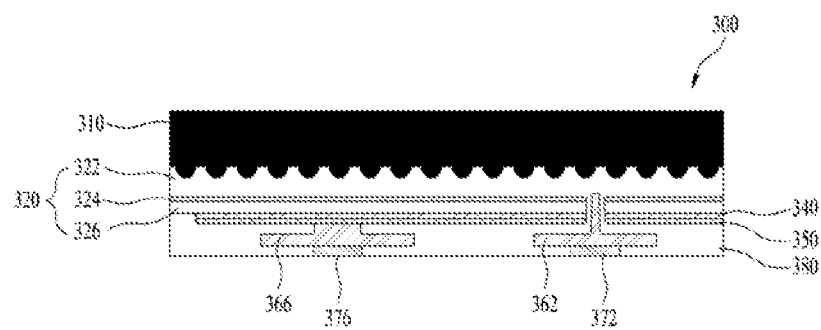

[Fig. 5a]
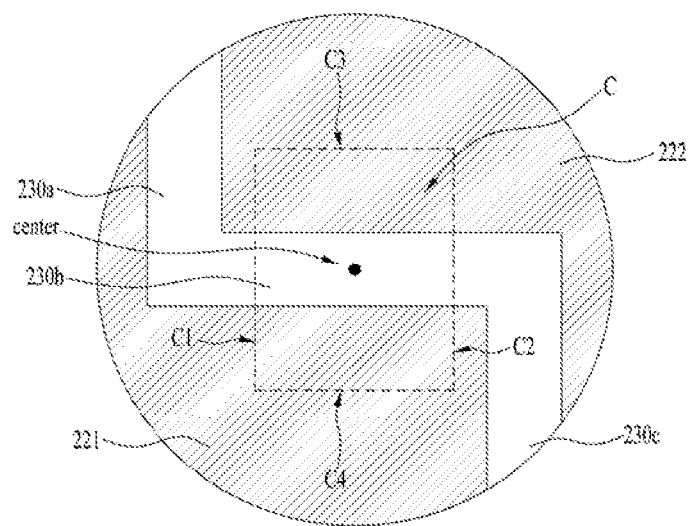
[Fig. 5b]
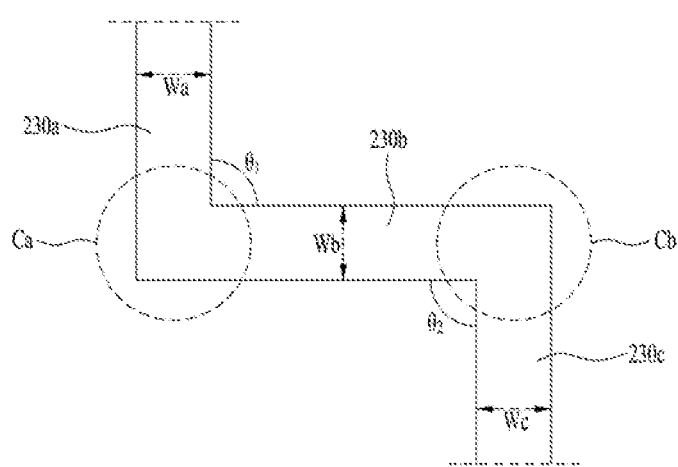

【Fig. 5c】
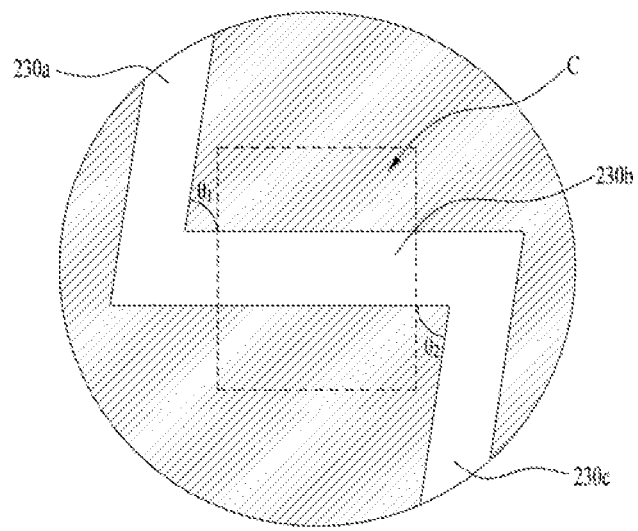
【Fig. 6a】
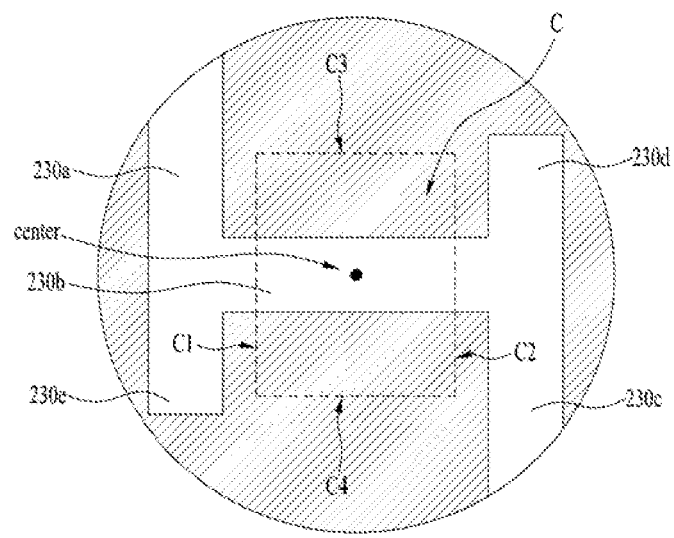

【Fig. 6b】
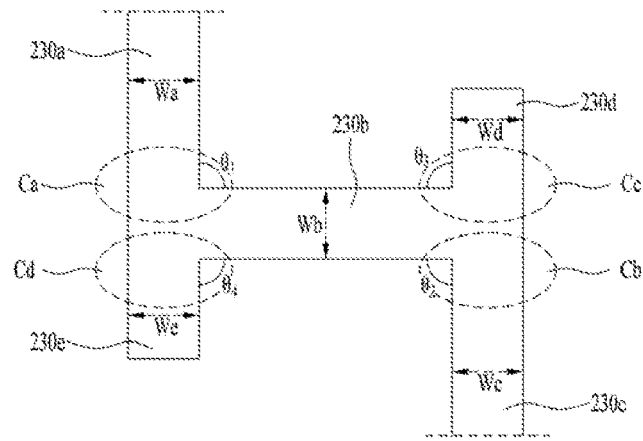
【Fig. 7】
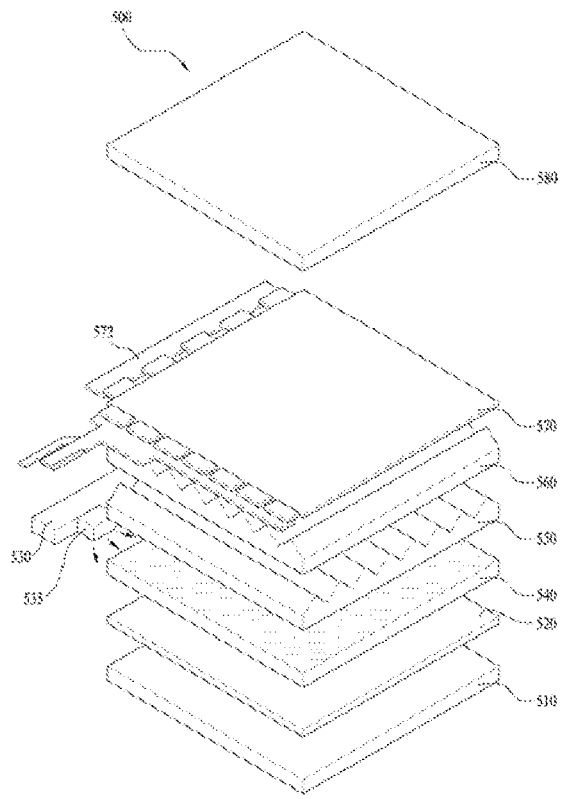

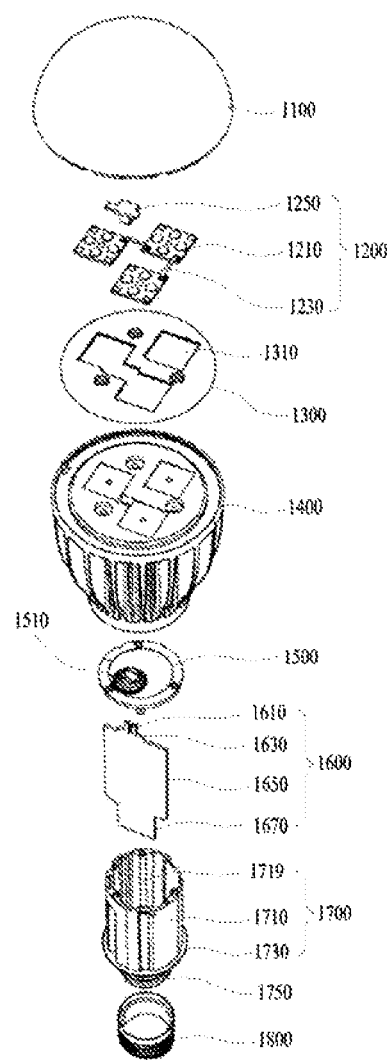
【Fig. 8】

LIGHT-EMITTING DEVICE PACKAGE

CROSS REFERENCE TO RELATED APPLICATIONS

This application is the National Phase of PCT International Application No. PCT/KR2015/011738, filed on Nov. 4, 2015, which claims priority under 35 U.S.C. 119(a) to Patent Application No. 10-2014-0160623, filed in Republic of Korea on Nov. 18, 2014, all of which are hereby expressly incorporated by reference into the present application.

TECHNICAL FIELD

Embodiments relate to a light-emitting device package, and more particularly, to a light-emitting device package in which a light-emitting device is flip-bonded.

BACKGROUND ART

Group III-V compound semiconductors such as, for example, GaN and AlGaN, are widely used for optoelectronics and electronic devices owing to many advantages such as, for example, a wide and easily adjustable band gap energy.

In particular, light-emitting devices such as light-emitting diodes or laser diodes using group III-V or II-VI compound semiconductors may realize various colors of light such as, for example, red, green, and blue light, as well as ultraviolet light, via the development of device materials and thin-film growth technique, and may also realize white light having high luminous efficacy via the use of a fluorescent material or by combining colors. These light-emitting devices have advantages of low power consumption, a semi-permanent lifespan, fast response speed, good safety, and eco-friendly properties compared to existing light sources such as, for example, fluorescent lamps and incandescent lamps.

Accordingly, the application of light-emitting devices has been expanded to a transmission module of an optical communication apparatus, a light-emitting diode backlight, which may substitute for a cold cathode fluorescent lamp (CCFL) constituting a backlight of a liquid crystal display (LCD) apparatus, a white light-emitting diode lighting apparatus, which may substitute for a fluorescent lamp or an incandescent bulb, a vehicle headlight, and a signal lamp.

In such a light-emitting device, a light-emitting structure, which includes an undoped semiconductor (un-GaN) layer, a first conductive semiconductor (n-GaN) layer, an active (MQW) layer, and a second conductive semiconductor (p-GaN) layer, may be formed over a substrate, which is formed of, for example, sapphire, and a first electrode and a second electrode may be disposed respectively on the first conductive semiconductor layer and the second conductive semiconductor layer.

In the light-emitting device, electrons injected through the first conductive semiconductor layer and holes injected through the second conductive semiconductor layer meet each other, thereby emitting light having energy determined by the inherent energy band of a constituent material of the active layer. The light emitted from the active layer may be changed according to the composition of the constituent material of the active layer, and may be blue light, ultraviolet (UV) light, deep UV light, or light of any other wavelength range.

FIG. 1 is a cross-sectional view of a conventional light-emitting device package, FIG. 2a is a view illustrating the area "A" of FIG. 1 in detail, and FIG. 2b is a plan view illustrating the area "A" of FIG. 1.

In the conventional light-emitting device package 100, a first lead frame 121 and a second lead frame may be disposed on a package body 110, and reflective layers 131 and 132 may be disposed respectively on the surfaces of the first lead frame 121 and the second lead frame 122.

The package body 110 may be provided with a cavity structure, and a light-emitting device 10 may be disposed on the bottom surface of a cavity. The light-emitting device 10 may be electrically connected to the first lead frame 121 and the second lead frame 122. This electrical connection may be realized via a conductive adhesive 140.

The cavity may be filled with a molding portion 160, which includes phosphors 165.

In FIG. 2a, when the light-emitting device 10 is a flip-chip type light-emitting device, the conductive adhesive 140, which electrically connects the first lead frame 121 and the second lead frame 122 to the light-emitting device 10, may be of a bump type.

At this time, horizontal force $F_h$ and vertical force $F_v$ may be generated from the first lead frame 121 and the second lead frame 122, and the vertical force $F_v$ to be transferred to the light-emitting device 10 may be relatively large. In addition, when the light-emitting device 10 is flip-chip bonded, the bump-shaped conductive adhesive 140 may directly come into contact with a light-emitting structure so that the above-described vertical force $F_v$ may be transmitted to the light-emitting structure, thus causing damage to the light-emitting structure.

In FIG. 2b, the light-emitting device 10 on the first lead frame 121 and the second lead frame 122 is illustrated by the dotted line. The vertical force $F_v$ of FIG. 2a may be greater than first horizontal force $F_{h1}$ and second horizontal force $F_{h2}$ transferred from the first lead frame 121 to the light-emitting device 10.

In the flip-bonding type light-emitting device described above, it is necessary to prevent the light-emitting structure from being damaged by the force transferred to the bump-shaped conductive adhesive.

Technical Object

Embodiments are provided to reduce the external force that is applied to a light-emitting device in a flip-bonding type light-emitting device package.

Technical Solution

An embodiment provides a light-emitting device package including a package body, a first lead frame and a second lead frame each having at least a portion inserted into the package body, and a light-emitting device electrically flip-bonded to the first lead frame and the second lead frame, wherein the package body forms an electrode separation line between the first lead frame and the second lead frame, and the electrode separation line has at least two bent portions.

The electrode separation line may have a width ranging from 150 μm to 250 μm in an area facing the light-emitting device.

The electrode separation line may include a first portion, a second portion disposed at a predetermined angle relative to the first portion, and a third portion disposed at a predetermined angle relative to the second portion.

Each of the predetermined angle between the first portion and the second portion and the predetermined angle between the second portion and the third portion may range from 45 degrees to 90 degrees.

The predetermined angle between the first portion and the second portion and the predetermined angle between the second portion and the third portion may be the same.

The first portion, the second portion, and the third portion may have the same width in an area facing the light-emitting device.

The first portion and the third portion may be disposed so as to be symmetrical to each other with respect to a center area of the second portion.

The first lead frame and the second lead frame may be disposed so as to be symmetrical to each other with respect to the center area of the second portion.

The second portion may be disposed so as to correspond to a bottom surface of the light-emitting device.

The first portion and the third portion may be disposed so as to correspond respectively to edges of two facing faces of the light-emitting device.

The light-emitting device may include a light-emitting structure including a first conductive semiconductor layer, an active layer, and a second conductive semiconductor layer, and a first electrode and a second electrode disposed respectively on the first conductive semiconductor layer and the second conductive semiconductor layer, and the first electrode and the second electrode may electrically come into surface contact with the first lead frame and the second lead frame.

The package body may define a cavity, and a boundary area of the first portion and the second portion and a boundary area of the second portion and the third portion may be exposed from a bottom surface of the cavity.

The package body may have a portion defining a sidewall of the cavity, and at least a portion of the first lead frame and the second lead frame may be disposed so as to correspond to the sidewall.

The electrode separation line may further include a fourth portion and a fifth portion, each of which is disposed at a predetermined angle relative to the second portion.

The fourth portion may be disposed parallel to the first portion, and the fifth portion may be disposed parallel to the third portion.

Another embodiment provides a light-emitting device package including a first lead frame and a second lead frame disposed in areas facing each other and each having at least two bent portions, an electrode separation line disposed between the bent portions of the first lead frame and the second lead frame, and a light-emitting device electrically flip-bonded to the first lead frame and the second lead frame.

The first lead frame, the second lead frame, and the electrode separation line may have surfaces forming a bottom surface of a cavity, and the electrode separation line may be disposed to extend to an area over the first lead frame and the second lead frame so as to form a sidewall of the cavity.

The first lead frame, the second lead frame, and the electrode separation line may have flat surfaces.

A further embodiment provides a light-emitting device package including a package body, a first lead frame and a second lead frame each having at least a portion inserted into the package body, and a light-emitting device electrically flip-bonded to the first lead frame and the second lead frame, wherein the package body forms an electrode separation line between the first lead frame and the second lead frame, wherein the electrode separation line has at least two bent portions, and includes a first portion, a second portion disposed at a predetermined angle relative to the first portion, and a third portion disposed at a predetermined angle relative to the second portion, wherein the predetermined angle between the first portion and the second portion and the predetermined angle between the second portion and the third portion are the same, and wherein the first portion and the third portion are disposed so as to be symmetrical to each other with respect to a center area of the second portion.

The second portion may be disposed so as to correspond to a bottom surface of the light-emitting device, and the first portion and the third portion may be disposed so as to correspond respectively to edges of two facing surfaces of the light-emitting device.

Advantageous Effects

A light-emitting device package according to embodiments eliminates the mobility of a lead frame because an electrode separation line is disposed to have at least two bent portions, and thus achieves strong coupling with the lead frame. Thereby, the amount of physical force applied from the lead frame to a light-emitting device or a light-emitting structure may be reduced, which may prevent damage to the light-emitting structure.

DESCRIPTION OF DRAWINGS

FIG. 1 is a cross-sectional view of a conventional light-emitting device package.

FIG. 2a is a view illustrating the area "A" of FIG. 1 in detail.

FIG. 2b is a plan view illustrating the area "A" of FIG. 1.

FIG. 3 is a perspective view of an embodiment of a light-emitting device package.

FIG. 4 is a view illustrating an embodiment of a light-emitting device of FIG. 3.

FIGS. 5a and 5b are views illustrating one embodiment of an electrode separation line of FIG. 3 in detail.

FIG. 5c is a view illustrating an embodiment in which the arrangement of the electrode separation line differs from that of FIGS. 5a and 5b.

FIGS. 6a and 6b are views illustrating another embodiment of the electrode separation line of FIG. 3 in detail.

FIG. 7 is a view illustrating an embodiment of an image display apparatus including a light-emitting device package.

FIG. 8 is a view illustrating an embodiment of a lighting apparatus including a light-emitting device package.

BEST MODE

Hereinafter, embodiments will be described in detail with reference to the accompanying drawings, in order to concretely realize the above object.

In the description of the embodiments disclosed here, it will be understood that, when an element is referred to as being formed "on" or "under" another element, it can be directly "on" or "under" the other element or be indirectly formed with intervening one or more elements therebetween. It will also be understood that "on" or "under" the element may be described relative to the drawings.

FIG. 3 is a perspective view of an embodiment of a light-emitting device package.

The light-emitting device package according to the embodiments may include a package body 210 having a cavity, a first lead frame 221 and a second lead frame 222 provided on the package body 210, and an electrode separation line 230 disposed on the bottom surface of the cavity, and the electrode separation line 230 may be integrated with the package body 210.

The electrode separation line 230, the first lead frame 221, and the second lead frame 222 may be exposed from the bottom surface b of the cavity, and the sidewall i of the cavity may be surrounded by the package body 210. The surfaces of the electrode separation line 230, the first lead frame 221 and the second lead frame 222, which constitute the bottom surface b of the cavity, may be flat, and the package body 210 defining the sidewall i may be formed via the extension of the electrode separation line.

In FIG. 3, although portions of the first lead frame 221 and the second lead frame 222 may be exposed from the bottom surface b of the cavity, other portions of the first lead frame 221 and the second lead frame 222 may be disposed below the sidewall i defined by the package body so as to correspond thereto.

A light-emitting device (not illustrated) may be disposed over a virtual area c, which is illustrated by the dotted line, on the bottom surface of the cavity, and the cavity may be filled with a molding portion (not illustrated) so as to protect the light-emitting device. The molding portion may include phosphors.

The package body 210 may be formed of a silicon material, a synthetic resin material, or a metal material. When the body 210 is formed of a conductive material such as, for example, a metal material, although not illustrated, the surface of the package body 210 may be coated with an insulation layer in order to prevent electrical short-circuit with the first and second lead frames 221 and 222.

The first lead frame 221 and the second lead frame 222 may be electrically separated from each other, may supply current to the light-emitting device, may reflect light generated in the light-emitting device so as to increase luminous efficacy, and may outwardly discharge heat generated in the light-emitting device.

At least a portion of each of the first lead frame 221 and the second lead frame 222 may be inserted into the package body 210, and the first lead frame 221 and the second lead frame 222 may be exposed respectively from the bottom surface b of the cavity with the electrode separation line 230 interposed therebetween.

At this time, the electrode separation line 230 may be disposed so as to be bent at least two times. The first lead frame 221 and the second lead frame 222, which are electrically separated from each other by the electrode separation line 230, may come into surface contact with the electrode separation line 230, and thus may have at least two bent areas. The structure of the electrode separation line will be described later in FIGS. 5a to 6b.

FIG. 4 is a view illustrating an embodiment of the light-emitting device of FIG. 3.

The light-emitting device 300 according to the present embodiment may be of a flip-chip type and may be flip-bonded to the first lead frame 221 and the second lead frame 222 via bumps (not illustrated). At this time, a light-emitting structure 320 may be disposed closer to the first lead frame 221 and the second lead frame 222 than a substrate 310.

The light-emitting device 300 may include the substrate 310, the light-emitting structure 320 including a first conductive semiconductor layer 322, an active layer 324, and a second conductive semiconductor layer 326, a light-transmitting conductive layer 340, a reflective layer 350, a first electrode 362, a second electrode 366, a first bonding pad 372, a second bonding pad 376, and a passivation layer 380.

The substrate 310 may be formed of a material suitable for the growth of a semiconductor material, or a carrier wafer, or may be formed of a material having excellent thermal conductivity. The substrate 310 may include a conductive substrate or an insulation substrate. For example, the substrate may be formed of at least one of sapphire ($Al_2O_3$), $SiO_2$, SiC, Si, GaAs, GaN, ZnO, GaP, InP, Ge, and $Ga_2O_3$.

When the substrate 310 is formed of, for example, sapphire and the light-emitting structure 320 including, for example, GaN or AlGaN is disposed on the substrate 310, because lattice mismatch between GaN or AlGaN and sapphire is very great and the difference between thermal expansion coefficients therebetween is also very great, for example, dislocation that deteriorates crystallinity, melt-back, cracks, pits, and surface morphology defects may occur. Therefore, a buffer layer (not illustrated) may be formed of, for example, AlN.

In addition, as illustrated, the surface of the substrate 310 is provided with an uneven structure, which may refract light that is emitted from the light-emitting structure 320 and proceeds to the substrate 310.

The light-emitting structure 320 may include the first conductive semiconductor layer 322, the active layer 324, and the second conductive semiconductor layer 326.

The first conductive semiconductor layer may be formed of group III-V or II-VI compound semiconductors, and may be doped with a first conductive dopant. The first conductive semiconductor layer 322 may be formed of a semiconductor material having a composition equation of $Al_xIn_yGa_{(1-x-y)}N$ ($0 \leq x \leq 1$, $0 \leq y \leq 1$, $0 \leq x+y \leq 1$), and for example, may be formed of any one or more of AlGaN, GaN, InAlGaN, AlGaAs, GaP, GaAs, GaAsP, and AlGaInP.

When the first conductive semiconductor layer 322 is an n-type semiconductor layer, the first conductive dopant may include an n-type dopant such as, for example, Si, Ge, Sn, Se, or Te. The first conductive semiconductor layer 322 may be formed in a single layer or in multiple layers, without being limited thereto.

The active layer 324 may be disposed on the upper surface of the first conductive semiconductor layer 322, and may include any one of a single well structure, a multi-well structure, a single quantum well structure, a multi quantum well structure, a quantum dot structure, and a quantum line structure.

The active layer 324 may have any one or more pair structures of a well layer and a barrier layer using group III-V compound semiconductors, for example, AlGaN/AlGaN, InGaN/GaN, InGaN/InGaN, AlGaN/GaN, InAlGaN/GaN, GaAs(InGaAs)/AlGaAs, and GaP(InGaP)/AlGaP, without being limited thereto. The well layer may be formed of a material, which has a smaller energy band gap than the energy band gap of the barrier layer.

The second conductive semiconductor layer 326 may be formed on the surface of the active layer 324 using a semiconductor compound. The second conductive semiconductor layer 326 may be formed of, for example, group III-V or II-VI compound semiconductors, and may be doped with a second conductive dopant. The second conductive semiconductor layer 326 may be formed of a semiconductor material having a composition equation of $In_xAl_yGa_{(1-x-y)}N$ ($0 \leq x \leq 1$, $0 \leq y \leq 1$, $0 \leq x+y \leq 1$), and may be formed of any one or more of AlGaN, GaN, AlInN, AlGaAs, GaP, GaAs, GaAsP, and AlGaInP.

The second conductive semiconductor layer 326 may be doped with a second conductive dopant. When the second conductive semiconductor layer 326 is a p-type semiconductor layer, the second conductive dopant may be a p-type dopant such as, for example, Mg, Zn, Ca, Sr or Ba. The second conductive semiconductor layer 326 may be formed in a single layer or in multiple layers, without being limited thereto.

The light-transmitting conductive layer 340 may be formed of, for example, indium tin oxide (ITO). Since the second conductive semiconductor layer 326 has a poor current spreading property, the light-transmitting conductive layer 340 may receive current from the second electrode 366.

The reflective layer 350 may be disposed below the light-transmitting conductive layer 340 and may reflect light that proceeds downward from the active layer 324.

A hole may be formed, starting from the reflective layer 350, to penetrate the light-transmitting conductive layer 340, the second conductive semiconductor layer 326, and the active layer 324 and extend to a portion of the first conductive semiconductor layer 322, and the first electrode 362 is formed. In addition, the second electrode 366 is formed on the surface of the reflective layer 350.

The first electrode 362 and the second electrode 366 may be formed in a single layer or in multiple layers using at least one of aluminum (Al), titanium (Ti), chrome (Cr), nickel (Ni), copper (Cu), and gold (Au).

In addition, the first bonding pad 372 and the second bonding pad 376 may be disposed on the first electrode 362 and the second electrode 366. The first bonding pad 372 and the second bonding pad 376 may come into contact with bumps respectively. Thereby, the first and second lead frames 221 and 222 may come into surface contact with the first and second electrodes 362 and 366.

The passivation layer 380 may be formed below the light-emitting structure 320. The passivation layer 380 may be formed of an insulating material. Specifically, the passivation layer 380 may be formed of an oxide or a nitride, and more specifically, may be configured as a silicon oxide ($SiO^2$) layer, a silicon nitride layer, or a silicon aluminum layer.

When the flip-chip type light-emitting device 300 of FIG. 4 is flip-bonded to the bottom surface b of the cavity of FIG. 3, the substrate 310 may be disposed at the upper side so that force from the first and second lead frames 221 and 222 may be directly transferred to the light-emitting structure 320.

Thus, when no distortion or other force occurs in the first and second lead frames 221 and 222, the durability of the light-emitting device package may be enhanced.

To this end, the first lead frame 221 and the second lead frame 222 need to be fixed to the package body 210. In the structure of FIG. 2b, since the first and second lead frames 121 and 122 may be easily separated from the package body 110 or may form a gap, in the present embodiment, the electrode separation line 230 may be bent, in particular, so as to form at least two bent portions, thereby stably fixing the first and second lead frames 221 and 222.

FIGS. 5a and 5b are views illustrating an embodiment of the electrode separation line of FIG. 3 in detail.

The electrode separation line 230 may be divided into a first portion 230a, a second portion 230b, and a third portion 230c on the basis of bent portions Ca and Cb, and the respective widths Wa, Wb and We thereof may range from 150 μm to 250 μm.

Although the bottom surface of the cavity has a circular cross section as illustrated in FIG. 5a, the bottom surface may have a square or other polygonal cross section. The entire second portion 230b is exposed from the bottom surface of the cavity. In addition, in FIG. 5b, both the boundary area including the bent portion Ca between the first portion 230a and the second portion 230b and the boundary area including the bent portion Cb between the second portion 230b and the third portion 230c may be exposed from the bottom surface of the cavity.

Since the electrode separation line 230 may be integrated with the package body 210, the respective widths Wa, Wb and We of the first portion 230a, the second portion 230b and the third portion 230c described above may be the width in the area facing the light-emitting device, i.e. the area exposed from the bottom surface b of the cavity, and may be the same.

When the respective widths Wa, Wb and We of the first portion 230a, the second portion 230b and the third portion 230c are less than 150 μm, the distance between the first lead frame 221 and the second lead frame 222 is excessively small, and thus there is a risk of electrical communication. When the widths are greater than 250 μm, the surface area of the entire light-emitting device package may be excessively increased.

The first portion 230a and the second portion 230b may form a predetermined angle $\theta_1$ therebetween, and the second portion 230b and the third portion 230c may form a predetermined angle $\theta_2$ therebetween.

The angle $\theta_1$ between the first portion 230a and the second portion 230b and the angle $\theta_2$ between the second portion 230b and the third portion 230c may be 90 degrees in FIG. 5b, but may range from 45 degrees to 90 degrees. When the above-described angles $\theta_1$ and $\theta_2$ are less than 45 degrees or greater than 90 degrees, the first lead frame 221 and the second lead frame 222 may be separated from the electrode separation line.

In addition, for the stable fixing of the first lead frame 221 and the second lead frame 222 and the positioning of the light-emitting device, the angle $\theta_1$ between the first portion 230a and the second portion 230b and the angle $\theta_2$ between the second portion 230b and the third portion 230c may be the same.

In FIG. 5a, the virtual area C in which the light-emitting device may be disposed is illustrated by the dotted line, and the first portion 230a and the third portion 230c may be symmetrical to each other about the center of the aforementioned area C. Here, the aforementioned center may be the center area of the second portion 230b.

In addition, when the first lead frame 221 and the second lead frame 222 are symmetrical to each other about the center of the above-described area C or the center area of the second portion 230b, the light-emitting device may be stably supported.

In FIG. 5a, the second portion 230b of the electrode separation line may be disposed so as to face the bottom surface of the light-emitting device. At this time, the light-emitting device may be disposed in the area C. In addition, the first portion 230a and the third portion 230c may be disposed so as to respectively correspond to the edges of two facing surfaces C1 and C2 of the light-emitting device so that portions thereof face each other. At this time, the area in which the light-emitting device may be disposed may be designated by C and four surfaces of the light-emitting device may correspond to C1 to C4.

FIG. 5c is a view illustrating an embodiment in which the arrangement of the electrode separation line differs from that of FIGS. 5a and 5b.

Although the present embodiment is identical to the embodiment of FIGS. 5a and 5b, the angle $\theta_1$ between the first portion 230a and the second portion 230b and the angle $\theta_2$ between the second portion 230b and the third portion 230c are 45 degrees.

FIGS. 6a and 6b are views illustrating another embodiment of the electrode separation line of FIG. 3 in detail.

The electrode separation line according to the present embodiment differs from that of the above-described embodiment in that a fourth portion 230d and a fifth portion 230e are additionally provided. Hereinafter, the electrode separation line according to the present embodiment will be described based on differences from the above-described embodiment.

The electrode separation line 230 may be divided into the first portion 230a, the second portion 230b, the third portion 230c, the fourth portion 230d, and the fifth portion 230e on the basis of bent portions Ca, Cb, Cc and Cd, and the respective widths Wa, Wb, Wc, Wd and We thereof may range from 150 μm to 250 μm.

In FIG. 6a, the entire second portion 230b is exposed from the bottom surface of the cavity. In FIG. 6b, all of the boundary area including the bent portion Ca between the first portion 230a and the second portion 230b, the boundary area including the bent portion Cb between the second portion 230b and the third portion 230c, the boundary area including the bent portion Cc between the second portion 230b and the fourth portion 230d, and the bent portion Cd between the second portion 230b and the fifth portion 230e may be exposed from the bottom surface of the cavity.

Since the electrode separation line 230 may be integrated with the package body 210, the respective widths Wa, Wb, Wc, Wd and We of the first portion 230a, the second portion 230b, the third portion 230c, the fourth portion 230d and the fifth portion 230e described above may be the width in the area facing the light-emitting device, i.e. the area exposed from the bottom surface b of the cavity, and may be the same.

When the respective widths Wa, Wb, Wc, Wd and We of the first portion 230a, the second portion 230b, the third portion 230c, the fourth portion 230d and the fifth portion 230e are less than 150 μm, the distance between the first lead frame 221 and the second lead frame 222 is excessively small, and thus there is a risk of electrical communication. When the widths are greater than 250 μm, the surface area of the entire light-emitting device package may be excessively increased.

The first portion 230a and the second portion 230b may form a predetermined angle $\theta_1$ therebetween, the second portion 230b and the third portion 230c may form a predetermined angle $\theta_2$ therebetween, the second portion 230b and the fourth portion 230d may form a predetermined angle $\theta_3$ therebetween, and the second portion 230b and the fifth portion 230e may form a predetermined angle $\theta_4$ therebetween.

The angle $\theta_1$ between the first portion 230a and the second portion 230b, the angle $\theta_2$ between the second portion 230b and the third portion 230c, the angle $\theta_3$ between the second portion 230b and the fourth portion 230d, and the angle $\theta_4$ between the second portion 230b and the fifth portion 230e may be 90 degrees in FIG. 6, but may range from 45 degrees to 90 degrees. When the above-described angles $\theta_1$, $\theta_2$, $\theta_3$, and $\theta_4$ are less than 45 degrees or greater than 90 degrees, the first lead frame 221 and the second lead frame 222 may be separated from the electrode separation line.

In addition, for the stable fixing of the first lead frame 221 and the second lead frame 222 and the positioning of the light-emitting device, the angle $\theta_1$ between the first portion 230a and the second portion 230b, the angle $\theta_2$ between the second portion 230b and the third portion 230c, the angle $\theta_3$ between the second portion 230b and the fourth portion 230d, and the angle $\theta_4$ between the second portion 230b and the fifth portion 230e may be the same.

In FIG. 6a, the virtual area C in which the light-emitting device may be disposed is illustrated by the dotted line. The first portion 230a and the third portion 230c may be symmetrical to each other and the fourth portion 230d and the fifth portion 230e may be symmetrical to each other, with respect to the center of the aforementioned area C. Here, the aforementioned center may be the center area of the second portion 230b.

In addition, when the first lead frame 221 and the second lead frame 222 are symmetrical to each other about the center of the aforementioned area C or the center area of the second portion 230b, the light-emitting device may be stably supported.

In FIG. 6a, the second portion 230b of the electrode separation line may be disposed so as to face the bottom surface of the light-emitting device. At this time, the light-emitting device may be disposed in the area C, and four surfaces of the light-emitting device may correspond to C1 to C4.

In addition, the first portion 230a and the third portion 230c may be disposed so as to respectively correspond to the edges of two facing surfaces C1 and C2 of the light-emitting device so that portions thereof face each other, and the fourth portion 230d and the fifth portion 230e may be disposed so as to respectively correspond to the edges of the two facing surfaces C1 and C2 of the light-emitting device so that portions thereof face each other. The first portion 230a and the fourth portion 230d may be disposed parallel to each other, and the third portion 230c and the fifth portion 230e may be disposed parallel to each other.

In the embodiment illustrated in FIGS. 6a and 6b, the electrode separation line has a shape similar to "H", and the fourth portion and the fifth portion are added compared to the electrode separation line according to the above-described embodiment. For example, when a sixth portion and a seventh portion additionally extend from the second portion of the electrode separation line, although the electrode separation line may achieve strong coupling with the lead frame, the space required to form the bump on the lead frame may be reduced.

The light-emitting device package according to the embodiments may eliminate the mobility of the lead frame because the electrode separation line is disposed so as to have at least two bent portions, and thus achieves strong coupling with the lead frame. Thereby, physical force applied from the lead frame to the light-emitting device or the light-emitting structure may be reduced, which may prevent damage to the light-emitting structure.

Hereinafter, as an embodiment of a lighting system in which the above-described light-emitting device package is disposed, an image display apparatus and a lighting apparatus will be described.

FIG. 7 is a view illustrating an embodiment of an image display apparatus including a light-emitting device package.

As illustrated, the image display apparatus 500 according to the present embodiment includes a light source module, a reflector 520 on a bottom cover 510, a light guide plate 540 disposed in front of the reflector 520 to guide light emitted from the light source module forward from the image display apparatus, a first prism sheet 550 and a second prism sheet 560 disposed in front of the light guide plate 540, a panel 570 disposed in front of the second prism sheet 560, and a color filter 580 disposed in front of the panel 570.

The light source module may include a light-emitting device package 535 on a circuit board 530, and the light-emitting device package 535 may be based on the above-described embodiment. Here, the circuit board 530 may be, for example, a printed circuit board.

The bottom cover 510 may accommodate constituent elements in the image display apparatus 500. The reflector 520 may be a separate element as illustrated in FIG. 7, or may be coated over the back surface of the light guide plate 540 or the front surface of the bottom cover 510 using a material having high reflectance.

The reflector 520 may be formed of a material that has high reflectance, and may be used in an ultra thin form. The reflector may be formed of polyethylene terephthalate (PET).

The light guide plate 540 scatters light emitted from the light-emitting device package, thus causing the light to be uniformly distributed throughout the overall area of the screen of a liquid crystal display apparatus. Accordingly, the light guide plate 540 may be formed of a material that has a high index of refraction and a high transmittance. The light guide plate may be formed of, for example, polymethylmethacrylate (PMMA), polycarbonate (PC) or polyethylene (PE). In addition, when the light guide plate 540 is omitted, an air-guide type display apparatus may be realized.

The first prism sheet 550 is formed on one surface of a support film using an elastic polymer material having light transmittance. The polymer material may include a prism layer in which multiple stereoscopic structures are repeatedly formed. Here, the multiple patterns, as illustrated, may be arranged in stripes in which valleys and ridges are repeated.

In the second prism sheet 560, the direction in which ridges and valleys are formed on one surface of a support film may be perpendicular to the direction in which the ridges and valleys are formed on one surface of the support film in the first prism sheet 550. This serves to uniformly distribute the light transmitted from the light-emitting module and the reflector to the panel 570 in all directions.

In the present embodiment, the first prism sheet 550 and the second prism sheet 560 form an optical sheet. The optical sheet may be any of different combinations, for example, a micro-lens array, a combination of a diffuser sheet and a micro-lens array, or a combination of a single prism sheet and a micro-lens array.

The panel 570 may be a liquid crystal display panel, and a different kind of display apparatus, which requires a light source, may be provided, rather than the liquid crystal display panel 560.

The panel 570 is configured such that liquid crystals are located between glass bodies, and in order to use the deflection of light, a polarizer is disposed on both the glass bodies. Here, the properties of the liquid crystals are intermediate to those of a liquid and a solid, and the liquid crystals, which are organic molecules having fluidity like liquid, are regularly arranged like crystals, and display an image using the arrangement of molecules, which is changed by an external electric field.

The liquid crystal display panel used in the display apparatus is of an active-matrix type, and uses a transistor as a switch that adjusts the voltage to be supplied to each pixel.

The color filter 580 may be provided on the front surface of the panel 570, and may show an image from the light that has passed through the panel 570 because respective pixels transmit only red, green and blue light.

FIG. 8 is a view illustrating an embodiment of a lighting apparatus including a light-emitting device package.

The lighting apparatus according to the present embodiment includes a cover 1100, a light source module 1200, a radiator 1400, a power supply unit 1600, an inner case 1700, and a socket 1800. In addition, the lighting apparatus according to the embodiment may further include any one or more of a member 1300 and a holder 1500, and the light source module 1200 may include the light-emitting device package according to the above-described embodiments.

The cover 1100 may have a bulb shape or a semispherical shape, and may be empty, and a portion of the cover 1100 may be opened. The cover 1100 may be optically coupled to the light source module 1200. For example, the cover 1100 may diffuse, scatter, or excite light provided from the light source module 1200. The cover 1100 may be one kind of an optical member. The cover 1100 may be coupled to the radiator 1400. The cover 1100 may have a coupling portion to be coupled to the radiator 1400.

The inner surface of the cover 1100 may be coated with an ivory white paint. The ivory white paint may include a diffuser that diffuses light. The surface roughness of the inner surface of the cover 1100 may be greater than the surface roughness of the outer surface of the cover 1100. This serves to sufficiently scatter and diffuse light from the light source module 1200 so as to emit the light outward.

The cover 1100 may be formed of glass, plastic, polypropylene (PP), polyethylene (PE), or polycarbonate (PC). Here, polycarbonate has excellent light-resistance, heat-resistance, and strength. The cover 1100 may be transparent so as to allow the light source module 1200 to be visible from the outside, or may be opaque. The cover 1100 may be formed via blow molding.

The light source module 1200 may be disposed on one surface of the radiator 1400, and heat generated from the light source module 1200 may be transferred to the radiator 1400. The light source module 1200 may include a light-emitting device package 1210, a connection plate 1230, and a connector 1250.

The member 1300 may be disposed on the upper surface of the radiator 1400, and may have a guide recess 1310 into which multiple light-emitting device packages 1210 and the connector 1250 are inserted. The guide recess 1310 may correspond to substrates of the light-emitting device packages 1210 and the connector 1250.

A light reflective material may be applied to or coated over the surface of the member 1300. For example, an ivory white paint may be applied to or coated over the surface of the member 1300. The member 1300 may reflect light, which has been reflected by the inner surface of the cover 1100 and returned to the light source module 1200, toward the cover 1100. Thus, the luminous efficacy of the lighting apparatus according to the embodiment may be increased.

The member 1300 may be formed of, for example, an insulating material. The connection plate 1230 of the light source module 1200 may include an electrically conductive material. Thus, the electrical contact between the radiator 1400 and the connection plate 1230 may be achieved. The member 1300 may be formed of an insulating material so as to prevent electrical short-circuit between the connection plate 1230 and the radiator 1400. The radiator 1400 may radiate heat transferred from the light source module 1200 and heat transferred from the power supply unit 1600.

The holder 1500 closes an accommodating recess 1719 in an insulating portion 1710 of the inner case 1700. Thus, the power supply unit 1600, which is accommodated in the insulating portion 1710 of the inner case 1700, may be sealed. The holder 1500 may have a guide protrusion 1510, and the guide protrusion 1510 may have a hole, through which a protruding portion 1610 of the power supply unit 1600 passes.

The power supply unit 1600 processes and converts an electrical signal received from the outside and provides the same to the light source module 1200. The power supply unit 1600 may be accommodated in the accommodating recess 1719 in the inner case 1700 and may be sealed inside the inner case 1700 by the holder 1500. The power supply unit 1600 may include the protruding portion 1610, a guide portion 1630, a base 1650, and an extension 1670.

The guide portion 1630 may protrude outward from one side of the base 1650. The guide portion 1630 may be inserted into the holder 1500. Multiple elements may be disposed on one surface of the base 1650. The multiple elements may include, for example, a DC converter that converts AC power, supplied from an external power source, into DC power, a drive chip that controls the driving of the light source module 1200, and an electrostatic discharge (ESD) protective element that protects the light source module 1200, without being limited thereto.

The extension 1670 may protrude outward from the other side of the base 1650. The extension 1670 may be inserted into a connecting portion 1750 of the inner case 1700, and may receive an external electrical signal. For example, the extension 1670 may have a width that is equal to or less than the width of the connecting portion 1750 of the inner case 1700. One end of each of a "positive electric wire" and a "negative electric wire" may be electrically connected to the extension 1670, and the other end of each of the "positive electric wire" and the "negative electric wire" may be electrically connected to the socket 1800.

The inner case 1700 may include a molding portion, in addition to the power supply unit 1600, therein. The molding portion is a solidified portion of molding liquid. The power supply unit 1600 may be fixed inside the inner case 1700.

When the lighting apparatus described above is used, for example, in a bicycle, a potential difference occurs in a piezoelectric element inside the light-emitting device package via the movement of the bicycle. Thereby, the lighting apparatus provided in the bicycle may be operated by a voltage generated in the piezoelectric element without the supply of power from the outside.

Although the exemplary embodiments have been illustrated and described as above, it will of course be apparent to those skilled in the art that the embodiments are provided to assist understanding and the embodiments are not limited to the above description, and various modifications and variations can be made in the embodiments without departing from the spirit or scope of the disclosure, and the modifications and variations should not be understood individually from the viewpoint or scope of the disclosure so long as they include the constituent elements set forth in the claims.

INDUSTRIAL APPLICABILITY

A light-emitting device package according to the embodiments may be stably fixed by a flip-bonding method.

The invention claimed is:

1. A light-emitting device package comprising:
a package body including a cavity;
an insulation layer disposed on a surface of the package body;
a first lead frame and a second lead frame each having at least a portion inserted into the package body; and
a light-emitting device electrically flip-bonded to the first lead frame and the second lead frame,
wherein the package body forms an electrode separation line between the first lead frame and the second lead frame, and the electrode separation line has at least two bent portions,
wherein the electrode separation line includes a first portion, a second portion disposed at a predetermined angle relative to the first portion, and a third portion disposed at a predetermined angle relative to the second portion,
wherein the first portion and the third portion are disposed so as to be symmetrical to each other with respect to a center area of the second portion, and
wherein portions of the first portion and the third portion are disposed at an upper region and a lower region of the bottom surface of the cavity, respectively.

2. The package according to claim 1, wherein the electrode separation line has a width ranging from 150 μm to 250 μm in an area facing the light-emitting device.

3. The package according to claim 1, wherein each of the predetermined angle between the first portion and the second portion and the predetermined angle between the second portion and the third portion ranges from 45 degrees to 90 degrees.

4. The package according to claim 1, wherein the predetermined angle between the first portion and the second portion and the predetermined angle between the second portion and the third portion are the same.

5. The package according to claim 1, wherein the first portion, the second portion, and the third portion have the same width in an area facing the light-emitting device.

6. The package according to claim 1, wherein the first lead frame and the second lead frame are disposed so as to be symmetrical to each other with respect to the center area of the second portion.

7. The package according to claim 1, wherein the second portion is disposed so as to correspond to a bottom surface of the light-emitting device.

8. The package according to claim 1, wherein the first portion and the third portion are disposed so as to correspond respectively to edges of two facing faces of the light-emitting device.

9. The package according to claim 1, wherein the light-emitting device includes a light-emitting structure including a first conductive semiconductor layer, an active layer, and a second conductive semiconductor layer, and a first electrode and a second electrode disposed respectively on the first conductive semiconductor layer and the second conductive semiconductor layer, and
wherein the first electrode and the second electrode electrically come into surface contact with the first lead frame and the second lead frame.

10. The package according to claim 1, wherein the package body defines a cavity, and a boundary area of the first portion and the second portion and a boundary area of the second portion and the third portion are exposed from a bottom surface of the cavity.

11. The package according to claim 10, wherein the package body has a portion defining a sidewall of the cavity, and at least a portion of the first lead frame and the second lead frame is disposed so as to correspond to the sidewall.

12. The package according to claim 1, wherein the electrode separation line further includes a fourth portion and a fifth portion, each of which is disposed at a predetermined angle relative to the second portion.

13. The package according to claim 12, wherein the fourth portion is disposed parallel to the first portion, and the fifth portion is disposed parallel to the third portion.

14. A light-emitting device package comprising:
a first lead frame and a second lead frame disposed in areas facing each other and each having at least two bent portions;

an electrode separation line disposed between the bent portions of the first lead frame and the second lead frame; and a light-emitting device electrically flip-bonded to the first lead frame and the second lead frame, wherein the electrode separation line includes a first portion, a second portion disposed at a predetermined angle relative to the first portion, and a third portion disposed at a predetermined angle relative to the second portion, and wherein the first portion and the third portion are disposed in point-symmetrically with respect to a center area of the second portion.

15. The package according to claim 14, wherein the first lead frame, the second lead frame, and the electrode separation line have surfaces forming a bottom surface of a cavity, and the electrode separation line is disposed to extend to an area over the first lead frame and the second lead frame so as to form a sidewall of the cavity.

16. The package according to claim 14, wherein the first lead frame, the second lead frame, and the electrode separation line have flat surfaces.

17. A light-emitting device package comprising:

a package body including a cavity;

a first lead frame and a second lead frame each having at least a portion inserted into the package body; and a light-emitting device electrically flip-bonded to the first lead frame and the second lead frame, wherein the package body forms an electrode separation line between the first lead frame and the second lead frame, wherein the electrode separation line has at least two bent portions, and includes a first portion, a second portion disposed at a predetermined angle relative to the first portion, and a third portion disposed at a predetermined angle relative to the second portion, wherein the predetermined angle between the first portion and the second portion and the predetermined angle between the second portion and the third portion are the same, and wherein the first portion and the third portion are disposed in point-symmetrically with respect to a center area of the second portion.

18. The package according to claim 17, wherein the second portion is disposed so as to correspond to a bottom surface of the light-emitting device, and wherein the first portion and the third portion are disposed so as to correspond respectively to edges of two facing surfaces of the light-emitting device.

19. The package according to claim 17, wherein the first portion and the third portion are disposed corresponding to edge portions of two opposing surfaces of the light emitting device, respectively.

20. The package according to claim 17, wherein the electrode separation line further includes a fourth portion and a fifth portion disposed at a predetermined angle relative to the second portion, the fourth portion is disposed parallel to the first portion, and the fifth portion is disposed parallel to the third portion.

* * * * *